(12) United States Patent  
Ishikawa et al.

(10) Patent No.: US 7,248,127 B2
(45) Date of Patent: Jul. 24, 2007

(54) CRYSTAL OSCILLATOR

(75) Inventors: Atsuhiro Ishikawa, Saitama (JP); Hideo Hashimoto, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 11/089,121

(22) Filed: Mar. 24, 2005

(65) Prior Publication Data
US 2005/0285690 A1 Dec. 29, 2005

(30) Foreign Application Priority Data
Mar. 25, 2004 (JP) ............... 2004-089809

(51) Int. Cl.
H03B 5/32 (2006.01)
H03L 1/00 (2006.01)

(52) U.S. Cl. ............ 331/158; 331/66; 331/116 R; 331/162; 331/176; 331/177 V

(58) Field of Classification Search ......... 331/158, 331/116 R, 70, 162, 176, 177 V, 66
See application file for complete search history.

(56) References Cited

U.S. PATENT DOCUMENTS

| | | | | |
|---|---|---|---|---|
| 3,457,529 A | * | 7/1969 | Merdian, Jr. | 333/234 |
| 4,833,426 A | * | 5/1989 | Robichon et al. | 331/158 |
| 5,341,112 A | * | 8/1994 | Haman | 331/116 R |
| 5,898,345 A | * | 4/1999 | Namura et al. | 331/177 V |
| 6,836,190 B2 | * | 12/2004 | Kato | 331/158 |
| 2002/0149434 A1 | * | 10/2002 | Toncich et al. | 331/158 |
| 2004/0189412 A1 | * | 9/2004 | Kato | 331/158 |

FOREIGN PATENT DOCUMENTS

JP 9-153740 6/1997

* cited by examiner

Primary Examiner—Benny Lee
Assistant Examiner—Levi Gannon
(74) Attorney, Agent, or Firm—Knobbe Martens Olson & Bear, LLP

(57) ABSTRACT

A quartz crystal oscillator in which phase noise is reduced includes: a resonance circuit having a quartz crystal unit and a split capacitor connected to the crystal unit; a transistor for oscillation having its base connected to the node of the crystal unit and the split capacitor; an output line for connecting the mutual node of the split capacitor to the emitter of the transistor; a quartz crystal resonator that is inserted in the output line; and a temperature compensation mechanism for compensating the frequency-temperature characteristics of both the crystal unit and the crystal resonator.

5 Claims, 3 Drawing Sheets

CRYSTAL OSCILLATOR

BACKGROUND OF THE INVENTION

1. Field of the Invention

The present invention relates to a quartz crystal oscillator in which a quartz crystal resonator is inserted into a feedback loop of an amplifier for oscillation to reduce phase noise, and more particularly to a crystal oscillator having excellent starting characteristics.

2. Description of the Related Arts

Crystal oscillators are often used in high-performance radio equipment because they have excellent oscillation frequency stability or the like.

The assignee of the present invention has already proposed a crystal oscillator that reduces phase noise in an oscillation output thereof in Japanese Patent Laid-Open Publication No. H09-153740 (JP, 9-153740A). FIG. 1 shows an example of the circuit configuration of a crystal oscillator of the prior art.

A crystal oscillator is basically composed of resonance circuit 1 and amplifier 2 for oscillation. Resonance circuit 1 is composed of quartz crystal unit 3 as an inductor component, and split capacitor 4a, 4b. Capacitors 4a, 4b are connected together in a series, and crystal unit 3 is parallel-connected to the series-connected pair of capacitors 4a, 4b. Amplifier 2 includes a transistor for oscillation, and this transistor has its base connected to the node of capacitor 4a and crystal unit 3, its emitter connected to the mutual node between capacitors 4a, 4b, and its collector connected to power supply Vcc. Amplifier 2 for oscillation feeds back and amplifies an oscillation frequency component that depends on resonance circuit 1. The emitter is both connected to output terminal Vout and to one end of load resistor R3. The other end of load resistor R3 is connected to the node of capacitor 4b and crystal unit 3. Output line 5 that makes up a portion of the feedback loop is further provided such that the node of capacitors 4a and 4b is connected to the emitter. Crystal resonator 6 is inserted into output line 5. Finally, bias resistors R1, R2 are provided for applying a bias voltage to the base of the transistor.

In this crystal oscillator, the resonance frequency of crystal resonator 6 is caused to generally match the oscillation frequency of the crystal oscillator. In this way, only the fundamental wave component of oscillation frequency f passes through crystal resonator 6, whereby the output signal becomes a narrow band and phase noise in the output signal can be reduced to a low level. In other words, crystal resonator 6 is used as a filter for eliminating spurious components in the oscillation output and extracting only the fundamental wave component.

To bring about a further stabilization of the oscillation frequency in this type of crystal oscillator, crystal unit 3 is normally accommodated in a thermostatic oven and thus caused to operate in a fixed-temperature state.

Curved line A of FIG. 2 shows the relation between temperature and frequency deviation $\Delta f/f$ where f is the nominal oscillation frequency of the crystal unit, and $\Delta f$ is the deviation of the actual oscillation frequency from the nominal oscillation frequency f. Typically, the frequency deviation exhibits a change that is represented by a cubic function curve with respect to temperature. As can be seen in this graph, the crystal unit has a minimum value of the oscillation frequency in the vicinity of 70° C., and the internal temperature of the thermostatic oven that accommodates crystal unit 3 is therefore normally set to the minimum value of approximately 70° C.

However, because the crystal oscillator of the above-described configuration uses a thermostatic oven, some time interval is required following the introduction of the power supply for the temperature in the thermostatic oven to reach a temperature of, for example, 70° C. During this time interval, the oscillation frequency will vary and the oscillation itself will be unstable, and this crystal oscillator therefore suffers from the problem of having a poor starting characteristic.

The crystal resonator also has a frequency-temperature characteristic that is a cubic function curve, as with the crystal unit. The crystal resonator is arranged outside the thermostatic oven, and the crystal resonator is designed such that when the temperature of the crystal resonator is at room temperature and the temperature of the crystal unit is, for example, 70° C., the resonance frequency of the crystal resonator will coincide with the fundamental wave component of the oscillation frequency of the crystal unit. However, the problem arises that if the temperature of the crystal unit is in the vicinity of room temperature immediately following the introduction of the power supply, as a result, the oscillation frequency due to the crystal unit will differ greatly from the resonance frequency of the crystal resonator, the fundamental wave component of the oscillation frequency will not pass through the crystal resonator, and the circuit will not oscillate.

The crystal resonator can also conceivably be accommodated in a thermostatic oven, but such a measure would necessitate a larger thermostatic oven in the crystal oscillator, and would both increase power consumption and hinder miniaturization of the crystal oscillator. In addition, the frequency-temperature characteristic of the crystal unit does not necessarily match the frequency-temperature characteristic of the crystal resonator, and in such a case, the resonance frequency of the crystal resonator and the oscillation frequency due to the crystal unit may differ depending on the ambient temperature even when the temperature of the two components is the same, and the possibility therefore exists that the circuit will not oscillate for the same reasons as described hereinabove.

SUMMARY OF THE INVENTION

It is an object of the present invention to provide a crystal oscillator that does not require a thermostatic oven, has a low level of phase noise in the oscillation output, features both compact size and lower power consumption, and moreover, has an excellent starting characteristic and thus reliably begins oscillation immediately after the introduction of the power supply.

The object of the present invention is achieved by a crystal oscillator which includes: a resonance circuit having a crystal unit and a split capacitor connected to the crystal unit; a transistor for oscillation having its base connected to the node of the crystal unit and the split capacitor; an output line for connecting the mutual node of the split capacitor to the emitter of the transistor; a crystal resonator that is inserted in the output line; and a temperature compensation mechanism for compensating the frequency-temperature characteristics of both the crystal unit and the crystal resonator.

In the present invention, the temperature compensation mechanism performs temperature compensation for both the crystal unit and the crystal resonator without requiring a thermostatic oven. According to the present invention, the oscillation frequency due to the crystal unit and the resonance frequency of the crystal resonator can be caused to approach each other within a prescribed range without regard to temperature, and the fundamental wave component of the oscillation frequency can pass through the quartz resonator at the time of activation of the quartz oscillator, whereby oscillation can be both reliably and stably realized. The crystal oscillator of the present invention has a low level of phase noise and is easily amenable to compact size and low power consumption.

DETAILED DESCRIPTION OF THE PREFERRED EMBODIMENTS

Figure 1:
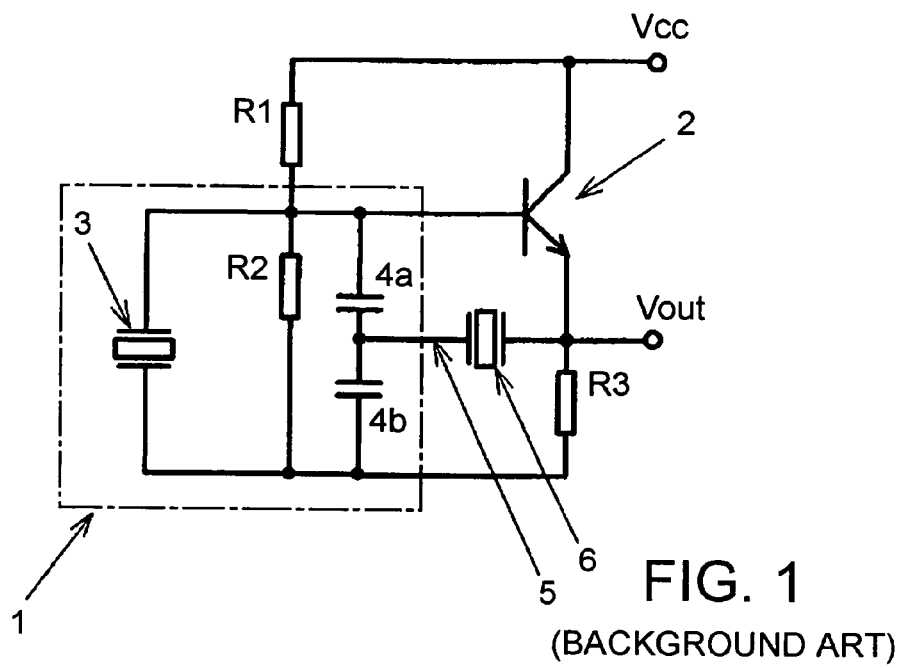
FIG. 1 is a circuit diagram showing an example of the configuration of a conventional crystal oscillator.
Figure 3:
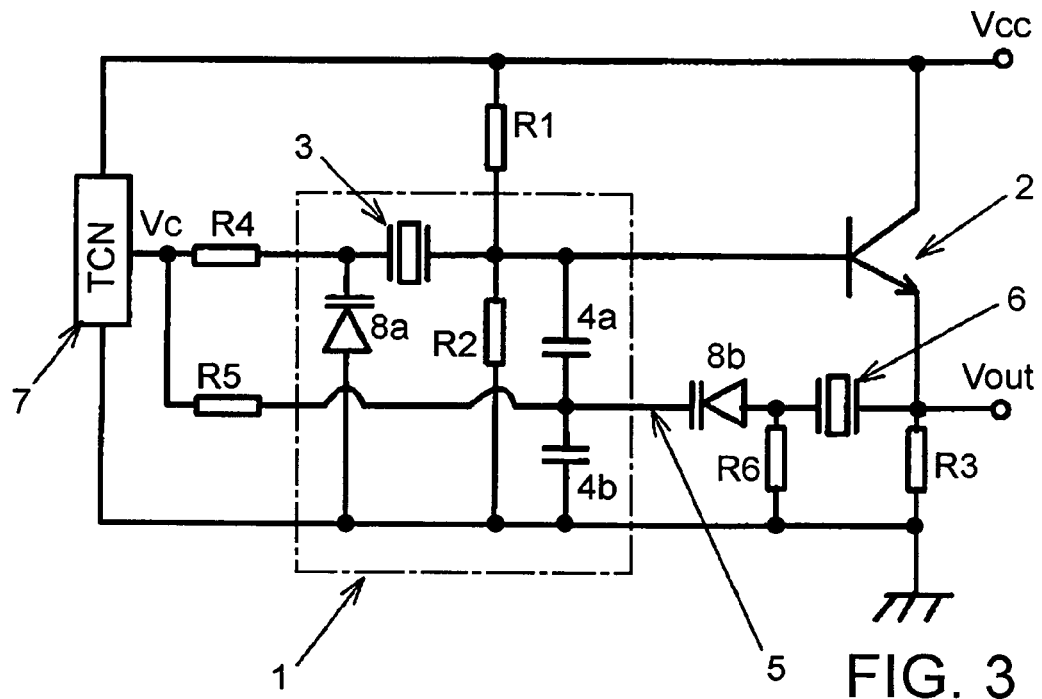
FIG. 3 is a circuit diagram showing the configuration of a crystal oscillator according to an embodiment of the present invention.

In FIG. 3, which shows a quartz crystal oscillator according to a preferable embodiment of the present invention, constituent elements that are identical to components in FIG. 1 are given the same reference numerals, and redundant explanation regarding these components is here omitted.

As with the crystal oscillator that was shown in FIG. 1, the crystal oscillator that is shown in FIG. 3 is provided with: resonance circuit 1 composed of quartz crystal unit 3 and split capacitor 4a, 4b; transistor 2 for oscillation which feeds back and amplifies an oscillation frequency component; and quartz crystal resonator 6 inserted in output line 5. In the circuit that is shown in FIG. 3, temperature compensation for crystal unit 3 and crystal resonator 6 is implemented by an indirect temperature compensation mechanism. As crystal unit 3, for example, a component having an AT-cut quartz blank or a component having a SC-cut quartz blank is used. As crystal resonator 6, for example, a component having an AT-cut quartz blank is used.

The indirect temperature compensation mechanism is composed of: compensating voltage generation circuit (TCN) 7, first voltage-variable capacitance element 8a, and second voltage-variable capacitance element 8b. Compensating voltage generation circuit 7 is composed of a circuit network of thermistors and resistors (not shown), is provided between power supply Vcc and the ground point, and generates compensating voltage Vc according to the ambient temperature. First and second voltage-variable capacitance elements 8a, 8b are made up from, for example, variable-capacitance diodes.

First voltage-variable capacitance element 8a is provided between the ground point and crystal unit 3 in resonance circuit 1 such that its anode is on the ground point side, and compensating voltage Vc is applied to its cathode by way of RF blocking resistor R4. Second voltage-variable capacitance element 8b is inserted in output line 5 between the mutual node of split capacitor 4a, 4b and crystal resonator 6 such that its anode is connected to crystal resonator 6. Compensating voltage Vc is supplied to the mutual node of split capacitor 4a, 4b by way of RF blocking resistor R5, whereby compensating voltage Vc is applied to the cathode of second voltage-variable capacitance element 8b. In addition, bias resistor R6 is provided between the anode of second voltage-variable capacitance element 8b and the ground point.

In this crystal oscillator, compensating voltage Vc which responds to the ambient temperature is applied to first and second voltage-variable capacitance elements 8a, 8b. The load capacitance as seen from crystal unit 3 accordingly changes according to temperature, and the resonance frequency of resonance circuit 1 to which first voltage-variable capacitance element 8a is connected also changes according to the temperature. Similarly, the resonance frequency of crystal resonator 6 to which second voltage-variable capacitance element 8b is connected also changes.

Figure 2:
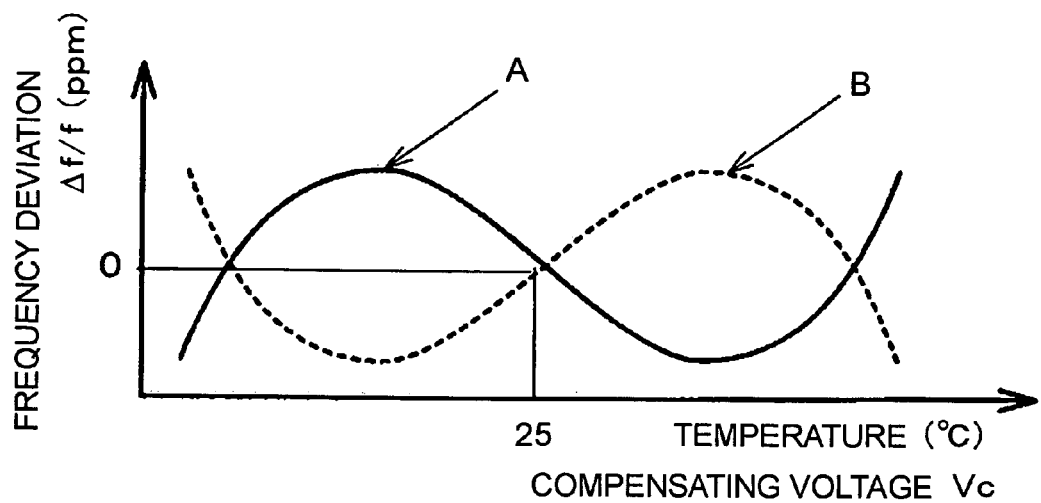
FIG. 2 is a graph for explaining the frequency-temperature characteristic and the compensating voltage for temperature of the crystal unit.

Compensating voltage generation circuit 7 accordingly generates compensating voltage Vc having a frequency characteristic that is opposite the frequency-temperature characteristic of crystal unit 3 and crystal resonator 6, as shown by curve B (dotted line) in the previously described FIG. 2. As a result, temperature compensation is carried out for crystal unit 3 and crystal resonator 6, and the frequency-temperature characteristics of crystal unit 3 and crystal resonator 6 can thus be evened. The actual configuration of a circuit for generating this type of compensating voltage Vc for the ambient temperature would be obvious to one skilled in the art.

In this crystal oscillator, the temperature compensation mechanism performs temperature compensation for crystal unit 3 and crystal resonator 6, and the need for the use of a thermostatic oven is thus eliminated. In the present embodiment, if the oscillation frequency due to crystal unit 3 and the resonance frequency of crystal resonator 6 are caused to coincide at a prescribed standard temperature, the oscillation frequency due to crystal unit 3 and the resonance frequency of crystal resonator 6 can be temperature-compensated despite changes in the ambient temperature, and as a result, oscillation output can be obtained in which phase noise is reduced to a low level and frequency stability is raised without regard to the ambient temperature. Because the oscillation frequency due to crystal unit 3 and the resonance frequency of crystal resonator 6 are always fixed and always matched, failure of the crystal oscillator to oscillate due to differences between these frequencies is prevented, and the crystal oscillator of the present embodiment therefore has an excellent starting characteristic. In addition, this crystal oscillator has no need for a thermostatic oven and therefore facilitates miniaturization, and further, features low power consumption.

Figure 4:
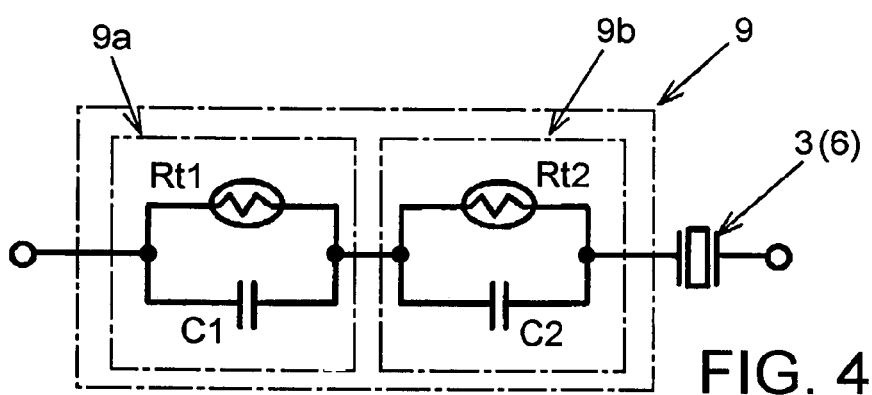
FIG. 4 is a circuit diagram showing the temperature compensation mechanism in the crystal oscillator according to another embodiment of the present invention.

The crystal oscillator according to the foregoing explanation uses an indirect temperature compensation mechanism which applies compensating voltage to voltage-variable capacitance elements in the load capacitances; the mechanism which generates compensating voltage according to the ambient temperature and the load capacitance for the crystal unit or crystal resonator being provided separately. Nevertheless, the temperature compensation mechanism used in the present invention is not limited to the indirect type. The present invention can also use a temperature compensation mechanism which is composed of, for example, thermistors and capacitors, and which is directly connected to the crystal unit or crystal resonator, i.e., a direct temperature compensation mechanism. FIG. 4 shows such a direct temperature compensation mechanism.

Figure 5:
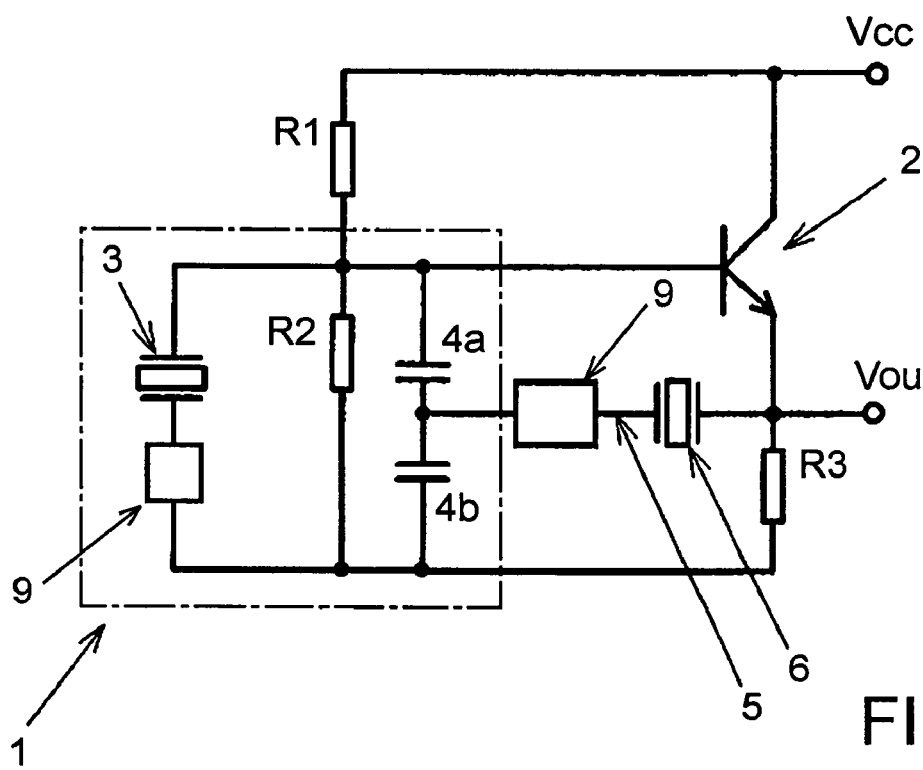
FIG. 5 is a circuit diagram showing the configuration of a crystal oscillator according to another embodiment of the present invention.

Temperature compensation circuit 9 shown in FIG. 4 is a configuration in which first thermistor Rt1 and first capacitor C1 are parallel-connected, second thermistor Rt2 and second capacitor C2 are parallel-connected, and these two parallel-connected units are connected in a series. The parallel-connected units are configured as high-temperature compensation circuit 9a and low-temperature compensation circuit 9b by adjusting the characteristics of the thermistors and the capacitance of the capacitors. As shown in FIG. 5, this temperature compensation circuit 9 is directly connected to one end of each of crystal unit 3 and crystal resonator 6.

What is claimed is:

1. A crystal oscillator comprising:
   a resonance circuit having a crystal unit and a split capacitor connected to said crystal unit;
   a transistor for oscillation having a base connected to a node of said crystal unit and said split capacitor;
   an output line for connecting an emitter of said transistor to a mutual node of said split capacitor;
   a crystal resonator inserted in said output line; and
   a temperature compensation mechanism for compensating frequency-temperature characteristics of both said crystal unit and said crystal resonator,
   wherein said temperature compensation mechanism comprises a first voltage-variable capacitance element connected to said crystal unit, a second voltage-variable capacitance element connected to said crystal resonator, and a single compensating voltage generation circuit for generating a compensating voltage according to ambient temperature, wherein said compensation voltage is applied to said first and second voltage-variable capacitance elements.

2. The crystal oscillator according to claim 1, wherein
   the first voltage-variable capacitance element is provided between a ground point and the crystal unit such that its anode is on the ground point side, and a compensating voltage from the temperature compensation mechanism is applied to its cathode by way of RF blocking resistor, and
   the second voltage-variable capacitance element is inserted in an output line between a mutual node of the split capacitor and the crystal resonator such that its anode is connected to the crystal resonator, and a compensating voltage from the temperature compensation mechanism is supplied to the mutual node of the split capacitor by way of an RF blocking resistor, thereby applying the compensating voltage to the cathode of the second voltage-variable capacitance element.

3. The crystal oscillator according to claim 2, further comprising a bias resistor provided between the anode of the second voltage-variable capacitance element and the ground point.

4. A crystal oscillator comprising:
   a resonance circuit having a crystal unit and a split capacitor connected to said crystal unit;
   a transistor for oscillation having a base connected to a node of said crystal unit and said split capacitor;
   an output line for connecting an emitter of said transistor to a mutual node of said split capacitor;
   a crystal resonator inserted in said output line; and
   a temperature compensation mechanism for compensating frequency-temperature characteristics of both said crystal unit and said crystal resonator,
   wherein said temperature compensation mechanism comprises a first temperature compensation circuit that is connected to said crystal unit, and a second temperature compensation circuit that is connected to said crystal resonator, wherein each of said temperature compensation circuits is provided with a thermistor and a capacitor.

5. A crystal oscillator comprising:
   a resonance circuit having a crystal unit and a split capacitor connected to said crystal unit;
   a transistor for oscillation having a base connected to a node of said crystal unit and said split capacitor;
   an output line for connecting an emitter of said transistor to a mutual node of said split capacitor;
   a crystal resonator inserted in said output line; and
   a temperature compensation mechanism for compensating frequency-temperature characteristics of both said crystal unit and said crystal resonator,
   wherein said temperature compensation mechanism comprises a first temperature compensation circuit that is connected to said crystal unit, and a second temperature compensation circuit that is connected to said crystal resonator, wherein each of said temperature compensation circuits is provided with a thermistor and a capacitor,
   wherein each of said temperature compensation circuits includes a high-temperature compensation circuit in which a first thermistor and a first capacitor are connected in parallel, and a low-temperature compensation circuit in which a second thermistor and a second capacitor are connected in parallel, wherein said high-temperature compensation circuit and said low-temperature compensation circuit are connected in series.

* * * * *